(12) United States Patent
Tischler

(10) Patent No.: US 7,998,829 B2
(45) Date of Patent: Aug. 16, 2011

(54) SEMICONDUCTOR STRUCTURE AND METHOD OF MANUFACTURE

(75) Inventor: Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 247 days.

(21) Appl. No.: 12/330,756

(22) Filed: Dec. 9, 2008

(65) Prior Publication Data

US 2009/0149009 A1 Jun. 11, 2009

Related U.S. Application Data

(60) Provisional application No. 61/012,871, filed on Dec. 11, 2007.

(51) Int. Cl.
*H01L 21/76* (2006.01)
(52) U.S. Cl. ... 438/424; 438/425; 438/435; 257/E21.54; 257/E21.545; 257/E21.564
(58) Field of Classification Search .................. 438/424, 438/425, 435; 257/E21.54, E21.545, E21.564
See application file for complete search history.

(56) References Cited

U.S. PATENT DOCUMENTS

| | | | | |
|---|---|---|---|---|
| 2009/0017593 A1* | 1/2009 | Wu et al. | | 438/424 |
| 2009/0017594 A1* | 1/2009 | Sumino et al. | | 438/424 |
| 2009/0029523 A1* | 1/2009 | Seo et al. | | 438/425 |
| 2010/0044858 A1* | 2/2010 | Cohn et al. | | 257/734 |
| 2010/0059849 A1* | 3/2010 | Quddus | | 257/476 |

* cited by examiner

*Primary Examiner* — Michelle Estrada
(74) *Attorney, Agent, or Firm* — Cool Patent, P.C.; Kenneth J. Cool

(57) ABSTRACT

In various embodiments, semiconductor structures and methods to manufacture these structures are disclosed. In one embodiment, a method includes removing a portion of a semiconductor material using an electrochemical etch to form a first cavity, a second cavity, wherein the first cavity is isolated from the second cavity, a first protrusion is between the first cavity and the second cavity, and the semiconductor material comprises silicon. The method further includes performing a thermal oxidation to convert a portion of the silicon of the semiconductor material to silicon dioxide and forming a first dielectric material over the first cavity, over the second cavity, over at least a portion of the semiconductor material, and over at least a portion of the first protrusion. Other embodiments are described and claimed.

21 Claims, 6 Drawing Sheets

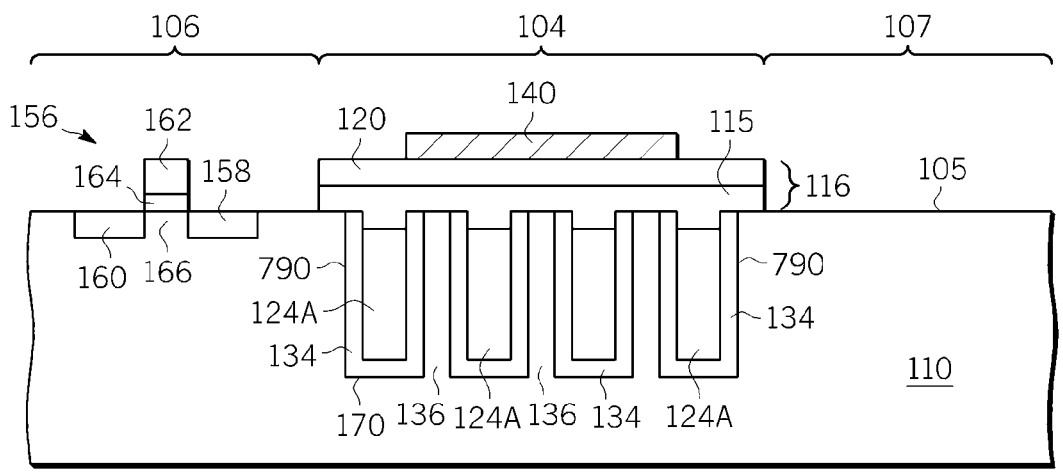
*FIG. 1*
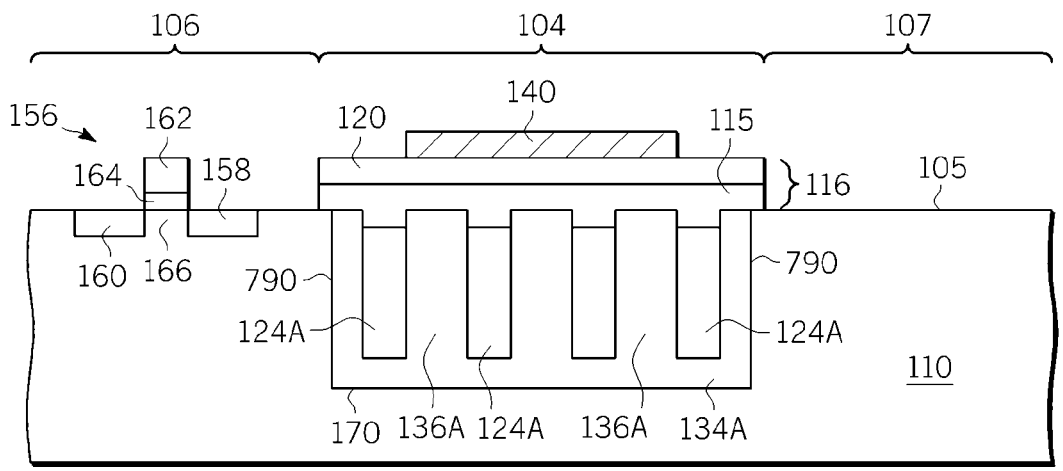
*FIG. 2*
*FIG. 3*
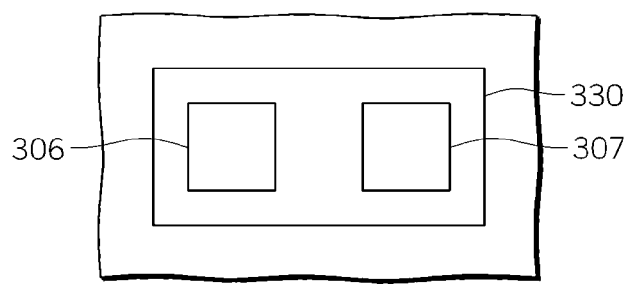

SEMICONDUCTOR STRUCTURE AND METHOD OF MANUFACTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, it may be contemplated to form integrated passive devices using semiconductor processing technology or it may be contemplated to integrate passive devices such as inductors and/or capacitors together with active devices such as transistors using conductive substrates. However, passive devices may have relatively low quality factors ("Qs") when these passive devices are formed on, or in relatively close proximity to, the conductive substrate. In addition, due to parasitic capacitive coupling between these passive devices and the conductive substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive substrate.

Further, it may be possible to physically and electrically isolate regions of a semiconductor substrate from each other. Additionally, some semiconductor devices, such as power transistors, provide relatively high output power, which may be utilized in some RF, industrial, and medical applications. Power transistor designers are continually seeking ways to efficiently increase output power by varying the output voltage and current characteristics of a power transistor. For example, it may be contemplated to have a power transistor that has an increased breakdown voltage to enable the power transistor to operate at a relatively higher voltage and provide a relatively higher output power.

Accordingly, it is contemplated to have semiconductor structures, and methods to make these structures, that may provide for reduced parasitic capacitances, relatively higher frequencies of operation, relatively higher breakdown voltages, relatively higher quality factor passive devices, increased isolation, or combinations thereof.

BRIEF DESCRIPTION OF THE DRAWINGS

FIG. 1 is a cross-sectional view of a semiconductor structure in accordance with an embodiment of the present invention;

FIG. 2 is a cross-sectional view of another semiconductor structure; in accordance with an embodiment of the present invention;

FIG. 3 is a plan view of another semiconductor structure in accordance with an embodiment of the present invention;

Figure 4:
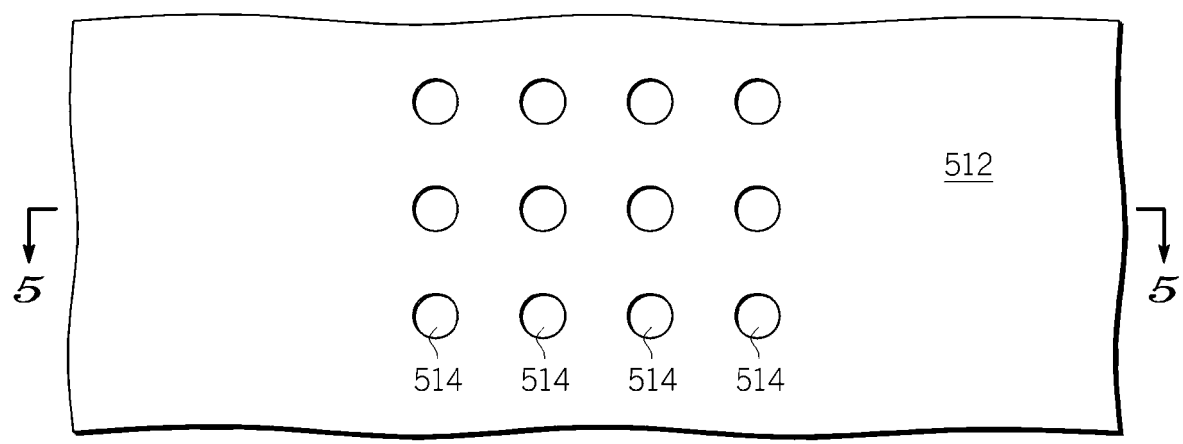
FIG. 4 is a plan view of the semiconductor structure of FIG. 1 at an early stage of fabrication.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 shows a cross-sectional view of semiconductor structure 100 that illustrates a dielectric platform (DP) 104, active regions 106 and 107, and an electrically conductive material 140. Dielectric platform 104 may be referred to as a dielectric structure or a dielectric region, and active regions 106 and 107 may also be referred to as active areas or active area regions or portions of active areas since active devices, or portions of active devices, may be formed in active areas 106 and 107.

Dielectric platform 104 of semiconductor structure 100 comprises vertical structures 136, sealed voids 124A, dielectric materials 134, and dielectric structure 116 over vertical structures 136, sealed voids 124A and dielectric materials 134. As will be discussed further below, at least a portion of dielectric platform 104 may be between electrically conductive material 140 and substrate 110 to reduce parasitic capacitance between electrically conductive material 140 and substrate 110. In other embodiments of the present invention, at least a portion of dielectric platform 104 is between at least a portion of electrically conductive material 140 and at least a portion of substrate 110 to reduce capacitance between electrically conductive material 140 and substrate 110.

Active regions 106 and 107 are comprised of a portion of substrate 110. In some embodiments of the present invention, substrate 110 may be referred to as a device layer or an active layer. Further, in some embodiments, substrate 110 may include one or more epitaxial layers or bonded layers. Substrate 110 may be used as an active area where active devices, such as, for example, transistors or diodes, or portions of active devices, may be subsequently formed. Active devices may be formed in active regions 106 and 107 using conventional MOS (metal oxide semiconductor), complementary metal oxide semiconductor (CMOS), bipolar, or bipolar-CMOS (BiCMOS) processes.

Substrate 110 may comprise a semiconductor material such as, for example, silicon, and may be doped or undoped depending on the application.

Sealed voids 124A and dielectric materials 134 together reduce the dielectric constant of dielectric platform 104. To minimize the dielectric constant of dielectric platform 104 it is desirable to increase the depth of dielectric platform 104, increase the volume of sealed voids 124A and reduce the extent of semiconductor material 110 contained in vertical structures 136. Increasing the depth of dielectric platform 104 while minimizing the extent of semiconductor material 110 contained in vertical structures 136 requires formation of high aspect ratio structures with a relatively small width compared to the depth, or the formation of structures with a relatively high ratio of void space to semiconductor and/or dielectric material. Conventional methods to form such high aspect ratios generally use relatively expensive and difficult to control etching processes, for example reactive ion etching and may also require complex and expensive patterning or lithography tools and processes.

The dielectric platform fabrication method disclosed herein utilizes a much less expensive, self-controlling electrochemical etch, resulting in relatively easier and less expensive processing, higher yield and the ability to produce dielectric platforms with lower dielectric constants. This method utilizes the fact that electrochemical etching can be used to make high aspect ratios using a relatively simple wet chemical etching process, thus eliminating the need for expensive etch tools such as reactive ion etching. Furthermore, the profile of the structure is determined by the etch composition, applied current and semiconductor resistivity and orientation. This technique permits the fabrication of very high aspect ratio structures, with controllable sidewall angles. By varying the process conditions and/or semiconductor properties, the profile of the structure can be varied in a controllable fashion. In an alternate embodiment of the present invention, electrochemical etching may be used without the need for lithography and patterning of relatively small dimension features and the associated complex and expensive lithography process.

Referring to FIG. 1, FIG. 1 shows a cross-sectional view of semiconductor structure 100, fabricated using electrochemical etching. In some embodiments, the width of voids 124A, the thickness of dielectric material 115, and the type of material used for dielectric material 115 are selected so that dielectric material 115 is rigid or substantially rigid. In some applications of dielectric platform 104 it is desirable for dielectric material 115 to be stiff, unbending, or inflexible.

Layers 115 and 120 together may form a dielectric cap structure 116 that may also be referred to as a dielectric sealing structure or dielectric enclosure. In contrast to sensors comprised of a cavity and a flexible cap, dielectric structure 116 of dielectric platform 104 comprised of dielectric layers 115 and 120 may be designed to be rigid, or substantially rigid in some embodiments. In a sensor the cap is flexible and elements embedded in the cap or formed over the cap are designed to sense the flexure of the cap and provide a signal proportional to the cap flexure. Dielectric structure 116 may be designed to be rigid, or substantially rigid such that the values of elements that may be formed on or within structure 116 are constant, or substantially constant. As discussed in some of the examples herein, the size and spatial relationship between the elements which comprise the dielectric platform 104 may be designed to form a rigid cap. For example, referring to FIG. 1 the widths of sealed voids 124A and the thickness of dielectric layers 115 and 120 may be chosen such that structure 116 is rigid, or substantially rigid. In addition, one or more vertical structures 136 may be formed to increase the rigidity of structure 116. Vertical structures 136 may also be referred to as protrusions or projections. While the example in FIG. 1 shows three vertical structures 136, this is not a limitation of the present invention. Further, while the example in FIG. 1 shows dielectric structure 116 comprised of two dielectric layers 115 and 120, this is not a limitation of the present invention. In other embodiments, dielectric structure 116 may include more or fewer dielectric layers.

In some embodiments sealed cavities 124A may have sidewalls 790 and 795 (FIG. 7) that are perpendicular, or substantially perpendicular to top surface 105. However, this is not a limitation of the present invention and sidewalls 790 and 795 (FIG. 7) of sealed cavities 124A may form an angle greater or less than 90° with top surface 105.

In some embodiments, the depth or thickness of dielectric platform 104 may range from about one micron (μm) to about forty microns and the width of dielectric platform 104 may be at least about three microns or greater. The depth or thickness of dielectric platform 104 is measured from top surface 105 of substrate 110 to a lower boundary or surface 170 of dielectric platform 104. In some embodiments, lower surface 170 of dielectric platform 104 is parallel to, or substantially parallel to surface 105 of substrate 110. In some embodiments, lower surface 170 of dielectric platform 104 is at a distance of at least about one micron or greater below surface 105. In other embodiments, the thickness of dielectric platform 104 may be about ten microns and the width of dielectric platform 104 may be about ten microns. In other embodiments, it may be desirable that the thickness of the dielectric platform be equal to, or approximately equal to, the thickness of semiconductor structure 100, that is, the thickness of the die.

Sealed voids 124A may be referred to as sealed voids, sealed air gaps, sealed cavities, closed cavities, closed cells, sealed pores or closed cell voids. In some embodiments, the width of sealed voids 124A ranges from about 0.1 μm to about 3.0 μm. In some embodiments, sealed voids 124A are hermetically sealed to prevent any contamination from undesirable gasses or moisture that may propagate into sealed voids 124A. Sealed voids 124A may be evacuated to a pressure less than atmospheric pressure. In other words, the pressure in sealed voids 124A is below atmospheric pressure. As an example, the pressure in sealed voids 124A may range from approximately 0.1 Torr to approximately 10 Torr. The type of substance or material within sealed voids 124A is not a limitation of the present invention. For example, sealed voids 124A may contain a gas, a fluid, or a solid matter.

Vertical structure 136 may be, for example, a pillar or a wall or a wall segment, and may comprise a portion of substrate 110 and portions of dielectric material 134 between sealed voids 124A. In some embodiments, sealed voids 124A have a circular, or substantially circular cross-section and vertical structures 136 surround the circular, or substantially circular sealed voids 124A. However, this is not a limitation of the present invention and sealed voids 124A may have, for example, various cross-sectional shapes such as, for example, circular, square, or rectangular, and for example, may also comprise trenches or trench segments.

As is discussed below, active devices, or portions of active devices, may be formed in substrate 110 and are not formed in material 110 of structure 136. In some embodiments, vertical structures 136 may comprise only dielectric material as shown in FIG. 2. FIG. 2 shows a cross-sectional view of semiconductor structure 200 wherein vertical structures 136 (FIG. 1), referenced as dielectric structures 136A in FIG. 2, are formed completely of a dielectric material. In some embodiments dielectric structures 136A may be a part of dielectric material 134 (FIG. 1), referenced as 134A in FIG. 2. For example, as is discussed below, in some embodiments, a thermal oxidation may be performed to convert a portion of substrate 110 to silicon dioxide, thereby forming silicon dioxide layer or region 134A which includes structures 136A.

Referring back to FIG. 1, FIG. 1 shows four sealed voids 124A. However the methods and apparatuses described herein are not limited in this regard. In other embodiments, fewer or more sealed voids may be formed in structure 100.

The combination of vertical structures 136, dielectric material 134 and sealed voids 124A reduces the overall permittivity of the dielectric platform 104 so that dielectric platform 104 has a relatively low dielectric constant. In some embodiments, a dielectric constant of about at least about 1.5 or lower may be achieved by increasing the volume of sealed voids 124A relative to the volume of vertical structures 136. The dielectric constant of dielectric platform 104 may also be reduced by increasing the volume of dielectric material 134 in vertical structures 136. Since empty space has the lowest dielectric constant (the dielectric constant of empty space is 1), the more empty space or void space incorporated into the dielectric platform, the lower the overall dielectric constant. Accordingly, increasing the volume of sealed voids 124A relative to the volume of vertical structures 136 is more effective in decreasing the dielectric constant of dielectric platform 104 compared to increasing the volume of dielectric material 134 in vertical structures 136.

The dielectric constant of dielectric platform 104 is reduced compared to, for example, what would be provided by a dielectric platform that has no air gaps or voids. Additionally, reduced thermal stress is induced in substrate 110 compared to a solid or filled dielectric structure (not shown), because dielectric platform 104 includes substantial volumes that are not occupied by solids having coefficients of thermal expansion that differ from that of substrate 110. Thermal stress can lead to dislocations and undesirable excessive leakage currents in devices formed in substrate 110. Reduced stress in dielectric platform 104 is also achieved by reducing the need for thick thermal oxide layers used in some alternate dielectric structures. Thick thermal oxides generate stress because of the 2.2× volume expansion that occurs when silicon is oxidized.

Silicon dioxide ($SiO_2$) has a dielectric constant of about 3.9. Accordingly, a solid or filled dielectric structure that includes no voids and includes silicon dioxide may have a dielectric constant of about 3.9.

In some embodiments described herein, dielectric platform 104 includes voids occupying in excess of 40% of the total volume of dielectric platform 104. This may result in an effective dielectric constant reduction of about 30% or greater, from a dielectric constant of about 3.9 to an effective dielectric constant of about 2.74. In one embodiment, dielectric platform 104 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 104 may result in a dielectric platform 104 having a dielectric constant of about 1.5 or less. As a result, passive elements formed from conductive material 140 formed over dielectric platform 104 have reduced parasitic capacitances to substrate 110. The parasitic substrate capacitance is reduced by both the reduced effective dielectric constant of dielectric platform 104 and the increased thickness of dielectric platform 104.

Dielectric platform 104 may also be used to provide electrical isolation in semiconductor structure 100. For example, dielectric platform 104 may provide electrical isolation between active region 106 and active region 107. In one example, dielectric platform 104 may be formed to completely surround either or both active regions 106 and 107. Turning briefly to FIG. 3, FIG. 3 shows a plan view of a semiconductor structure 300 in which a single dielectric platform 330 completely surrounds active areas 306 and 307. Although rectangular shaped active areas 306 and 307 and a rectangular shaped dielectric platform 330 are illustrated in FIG. 3, this is not a limitation of the present invention. In other embodiments, dielectric platform 330 and active areas 306 and 307 may have any arbitrary shape. Although dielectric platform 330 illustrated in FIG. 3 is described as surrounding at both active areas 306 and 307, this is not a limitation of the present invention. In other embodiments, one or more dielectric platforms may surround none, or one or more of the active areas and/or one or more dielectric platforms may be formed adjacent to or abutting a portion of one or more active areas.

Turning back to FIG. 1, since at least a portion of dielectric platform 104 is formed in and below surface 105 of substrate 110; dielectric platform 104 may be referred to as an embedded dielectric structure. Embedded may mean that at least a portion of dielectric platform 104 is below a plane (not shown) that is coplanar to, or substantially coplanar to, top surface 105 of substrate 110. In some embodiments, the portion of dielectric platform 104 below the plane extends from the plane to a depth of at least about one micron or greater below the plane and the portion of dielectric platform 104 below the plane has a width of at least about three microns or greater. In other words, at least a portion of dielectric platform 104 is embedded in substrate 110 and extends a distance of at least about one micron or greater from upper surface 105 toward the bottom surface of substrate 110 and the portion of dielectric platform 104 embedded in substrate 110 has a width of at least about three microns or greater in some embodiments.

In addition, dielectric platform 104 may be used to increase the frequency of operation of any devices formed using semiconductor structure 100. For example, passive components such as, for example, inductors, capacitors, or electrical interconnects, may be formed over the embedded dielectric platform 104 and may have reduced parasitic capacitive coupling between these passive components and substrate 110 since the embedded dielectric platform 104 has a relatively low dielectric constant or permittivity and since the embedded dielectric platform 104 increases the distance between the passive components and the conductive substrate. Reducing parasitic substrate capacitances may increase the frequency of operation of any devices formed using semiconductor structure 100. As an example, the passive component may comprise electrically conductive material 140, wherein electrically conductive material 140 may comprise, for example, aluminum, copper, or doped polycrystalline silicon. In various examples, the passive component may be an inductor, a capacitor, a resistor, or an electrical interconnect and may be coupled to one or more active devices formed in active regions 106 and 107.

Further, dielectric platform 104 may be used to form relatively high quality passive devices such as, for example, capacitors and inductors having a relatively high quality factor (Q) since the dielectric platform 104 may be used to isolate and separate the passive devices from the substrate. Active devices, such as transistors or diodes, may be formed in regions adjacent to, or abutting, the dielectric platform 104, and these active devices may be coupled to and employ passive components such as spiral inductors, interconnects, microstrip transmission lines and the like that are formed on a planar upper surface of dielectric platform 104. Separating the passive components from substrate 110 allows higher Q's to be realized for these passive components.

As an example, a field effect transistor (FET) 156 may be formed in active region 106. FET 156 may be a MOSFET and may include a source region 158 in a portion of substrate 110, a drain region 160 in a portion of substrate 110, a gate dielectric 164 over a portion of substrate 110, a gate 162 over gate dielectric 164, and a channel region 166 formed in a portion of substrate 110 under gate dielectric 164 and between doped regions 158 and 160.

Substrate 110 may serve as part of a drain region of a vertical transistor (not shown) formed in active region 107. In this example, a source contact or electrode (not shown) may be formed on or adjacent to an upper surface of substrate 110 and a drain electrode (not shown) may be formed on or adjacent to a lower surface of substrate 110. During operation, the electrical current flow from the source electrode to the drain electrode in the vertical transistor may be substantially perpendicular to the upper and lower surfaces of semiconductor substrate 110. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in U.S. patent application Ser. No. 10/557,135, entitled "POWER SEMICONDUCTOR DEVICE AND METHOD THEREFORE" filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Although only a single active device is discussed as being formed in active regions 106 and 107 of substrate 110, the methods and apparatuses described herein are not limited in this regard. In some embodiments, a plurality of active devices may be formed in active regions 106 and 107 of substrate 110.

Figure 5:
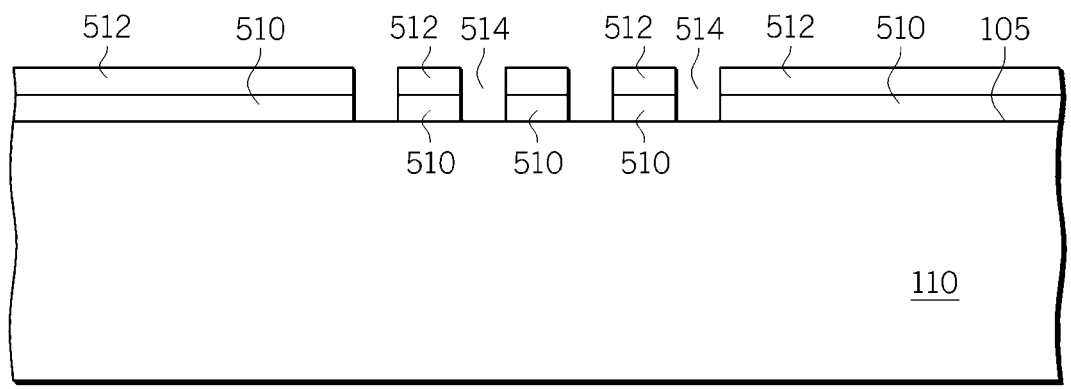
FIG. 5 is a cross-sectional view of the semiconductor structure of FIG. 4 taken along section line 5-5 of FIG. 4.

FIGS. 4 to 8 illustrate at least one embodiment for making structure 100 of FIG. 1. Turning to FIGS. 4 and 5, FIG. 4 shows a plan view of the semiconductor structure 100 of FIG. 1 at an early stage of fabrication and FIG. 5 shows a cross-sectional view of semiconductor structure 100 taken along section line 5-5 of FIG. 4. At the stage illustrated in FIG. 5, dielectric layer 510 is formed over substrate 110 and dielectric layer 512 is formed over dielectric layer 510. In one example dielectric layer 510 may be silicon dioxide and dielectric layer 512 may be silicon nitride. Dielectric layer 510 may comprise, for example, silicon dioxide and have a thickness ranging from about 50 Angstroms (Å) to about 5,000 Angstroms. Dielectric layer 510 may be formed using deposition techniques or thermal growth techniques such as, for example, thermal oxidation of silicon. Dielectric layer 512 may comprise, for example, silicon nitride ($Si_3N_4$) and have a thickness ranging from about 100 Angstroms (Å) to about 15,000 Angstroms. Dielectric layer 512 may be formed using deposition techniques, for example, low pressure chemical vapor deposition (LPVCD) of silicon nitride.

In an alternate embodiment, only dielectric material 510 may be formed (not shown). Dielectric layer 510 may comprise, for example, silicon dioxide and have a thickness ranging from about 1000 Angstroms (Å) to about 20,000 Angstroms.

After dielectric layer 512 is formed, dielectric layer 512 and dielectric layer 510 may be patterned using photolithography and etching processes to form openings 514. Photolithography processes or operations involve the use of masks and may sometimes be referred to as masking operations or acts. The photolithography and etching may include forming a layer of a radiation-sensitive material, such as, for example, photoresist (not shown), over dielectric layer 512, then exposing the photoresist using, for example, ultraviolet (UV) radiation and developing the resist to form a mask, and then etching portions of dielectric layers 512 and 510 to form openings 514.

Openings 514 may be formed using at least one etching operation. In some embodiments, two etching operations may be used to form openings 514. In some embodiments, silicon nitride layer 512 may be etched using a wet chemical etch or a dry etch process such as, for example, a reactive ion etch (RIE). Silicon dioxide layer 510 may be etched using a wet chemical etch or a dry etch process such as, for example, a reactive ion etch (RIE).

In one example openings 514 may be in the range of about 0.1 micron to about 3 microns and the spacing between openings 514 may be in the range of about 0.3 microns to about 3 microns. Although the size of openings 514 and the spacing between openings 514 shown in FIG. 5 are substantially the same, this is not a limitation of the present invention. The spacing between openings 514 and the size of openings 514 do not have to be the same, or substantially the same. Further, although openings 514 are shown as circular, or substantially circular and formed in a regular periodic array, this is not a limitation of the present invention. Openings 514 may have any shape and may be formed in a periodic or non-periodic arrangement.

Dielectric layer 512 or a combination of dielectric layer 510 and dielectric layer 512 may serve as a hard mask, and may be referred to as a masking layer. Since the photoresist (not shown) over dielectric 512 may optionally be left in place during the next etch step, it may also be etched as part of the etch step used to etch portions of dielectric layer 512, portions of dielectric layer 510 and portions of substrate 110. Dielectric layer 512 or a combination of dielectric layer 510 and dielectric layer 512 may be used as a hard mask to prevent the undesired etching of the upper surface of substrate 110 during the formation of openings 514 and subsequent removal of a portion of substrate 110 exposed by openings 514. In alternate embodiments, the photoresist layer may be made relatively thick such that it is not completely eroded during the etching process. Accordingly the thickness of dielectric material 510 or the combination of dielectric materials 510 and 512 must be large enough so that it is not completely removed during the next etching step.

Figure 6:
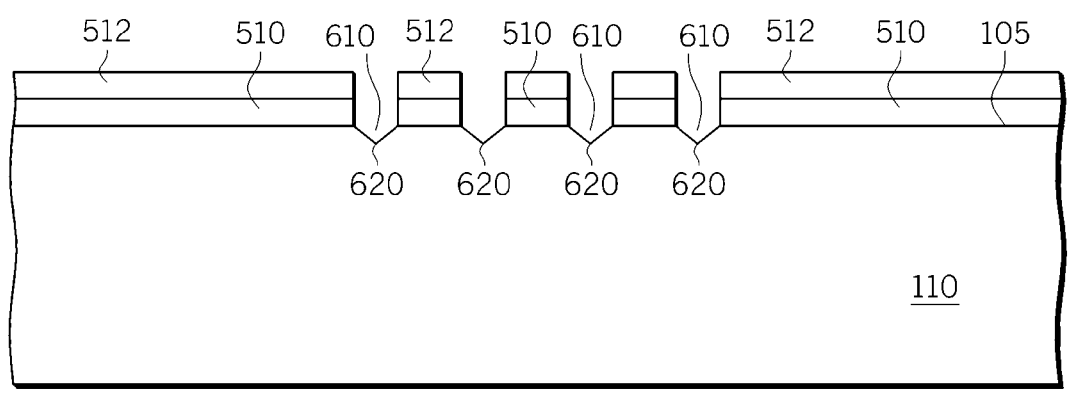
FIG. 6 is a cross-sectional view of the semiconductor structure of FIG. 5 at a later stage of fabrication.

In one embodiment of the present invention, two etching steps are used to form sealed voids 124A (FIG. 1), although the methods and apparatuses described herein are not limited in this regard. Turning now to FIG. 6, which shows semiconductor structure 100 of FIG. 5 at a later stage of manufacture, the first etch step in this embodiment may be an etch that removes a portion of substrate 110 under openings 514 to form pits 610 with a shape such that the bottom of the pit has a relatively smaller extent than the opening of pits 610 at surface 105. The purpose of forming pits 610 with a reduced extent at the bottom compared to the opening, or a sharp point 620 at the bottom, is to concentrate the electric field at the bottom of pits 610 during the next step which is the electrochemical etch. In one example the pits may have a depth ranging from about 0.05 microns to about 2.5 microns.

Figure 7:
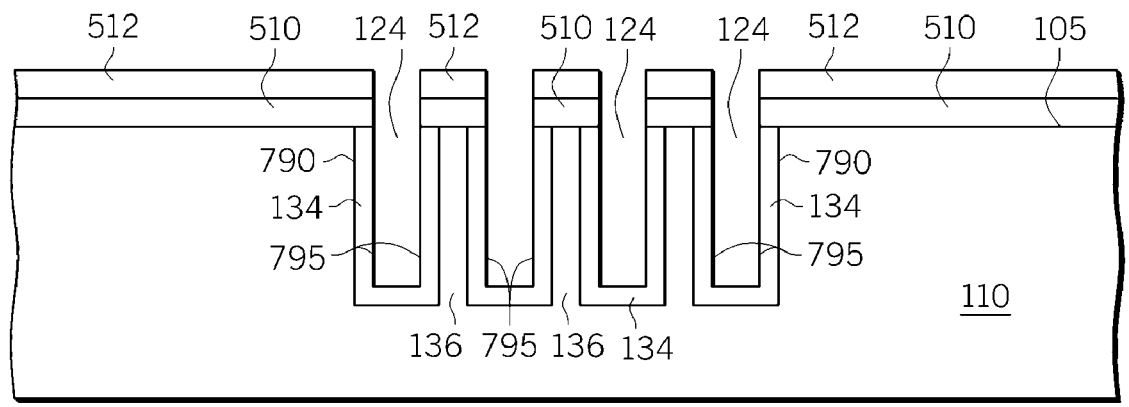
FIG. 7 is a cross-sectional view of the semiconductor structure of FIG. 6 at a later stage of fabrication.

Pits 610 may be called pits, starter cavities or initial cavities. Pits 610 will become cavities 124 (FIG. 7). In one embodiment pits 610 may have an inverted pyramidal shape with a point 620 at the bottom. In one example where substrate 110 comprises silicon and is oriented with surface 105 of silicon substrate 110 perpendicular to, or substantially perpendicular to the <100> direction of the crystal lattice of silicon substrate 110, pits 610 may be formed using an orientation-dependent etch chosen, for example, from those based on potassium hydroxide (KOH), ethylene diamine pyrocatechol (EDP), tetramethylammonium hydroxide (TMAH) or hydrazine. These etches have very low etch rates for the <111> direction of the silicon crystal lattice compared to other directions, for example the <100> or <110> directions. The surface morphology of the etched surfaces, absolute etch rate in each crystallographic direction, and the relative etch rates in different crystallographic directions are dependent on the specific concentration of the etchant and the etchant temperature. In this example an etch rate ratio between the <100> and <111> directions is typically greater than 30:1, and preferably greater than 100:1. Although a circular shaped mask opening is illustrated in FIG. 4, this is not a limitation of the present invention. Mask openings may be square, rectangular or of any arbitrary shape.

Turning now to FIG. 7, FIG. 7 shows semiconductor structure 100 of FIG. 6 at a later stage of fabrication. After formation of pits 610 with sharp points 620, cavities 124 may be formed in substrate 110 using an electrochemical etch process which removes a portion of substrate 110 under pits 610. Cavities 124 may be referred to as voids, air gaps, cavities, open cavities, pores, open voids, openings, trenches, or air gaps.

Figure 8:
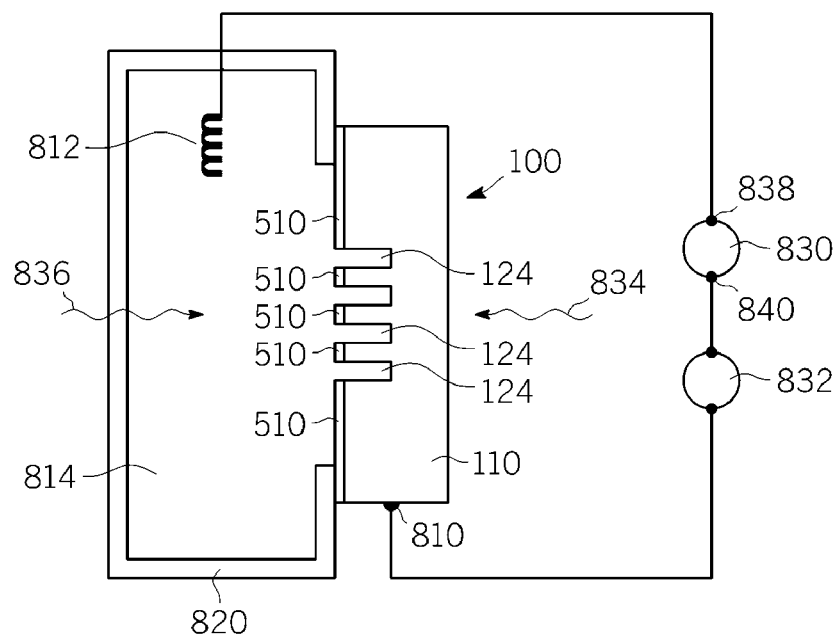
FIG. 8 is a schematic of an apparatus that may be used for electrochemical etching, accordance with an embodiment of the present invention.

Electrochemical etching, also called anodization, may be performed using an apparatus schematically shown in FIG. 8 comprising a container 820 for an electrolyte 814, an electrode 812, a potentiostat or current source 830 and optionally a source of illumination 834 and 836. Container 820 is coupled to semiconductor structure 100 such that electrolyte 814 is in contact with at least a portion of semiconductor structure 100. Terminal 838 of potentiostat 830 may be coupled to electrode 812 which may be coupled to electrolyte 814. In one example electrode 812 may comprise platinum. Terminal 840 of potentiostat 830 may be coupled to substrate 110 through contact 810. Meter 832 may be coupled in series with the potentiostat and may measure the current flow from potentiostat 830. In FIG. 8, meter 832 is coupled between terminal 840 of potentiostat 830 and contact 810 of semiconductor structure 100. The front side of semiconductor structure 100 may be optionally illuminated with front illumination 836. The back side of semiconductor structure 100 may be optionally illuminated with back illumination 834.

In the example where substrate 110 is comprised of silicon, electrolyte 814 may comprise a solution of hydrofluoric acid (HF) and water. Electrolyte 814 may optionally include ethanol and/or a wetting agent. In one example electrolyte 814 may comprise a solution of water, ethanol and hydrofluoric acid with proportions in the range of 15% to 98% water, 0% to 50% ethanol and 2% to 35% hydrofluoric acid. In another example, substrate 110 may comprise p-type silicon, electrolyte 814 may comprise a solution of water, ethanol and hydrofluoric acid with proportions in the range of 70% to 95% water, 0% to 20% ethanol and 5% to 10% hydrofluoric acid. In general, holes are believed to be desired for the etch process to proceed when substrate 110 is comprised of silicon, thus for n-type silicon, substrate 110 may be illuminated to enhance the etch rate.

Referring back to FIG. 6, points 620 at the bottom of pits 610 may act to concentrate the electric field at the bottom of pits 610 resulting in all, or substantially all of the etching of substrate 110 to occur at the bottom of pits 610. In other words the electric field is relatively higher at the bottom of pits 610 than at the top or sides of pits 610. The electric field may remain relatively higher at the bottom of the pit compared to other regions of the pit as the etch proceeds, thus forming cavities 124 (FIG. 7) having a relatively high aspect ratio. In other words, cavities 124 (FIG. 7) are formed through electrochemical etching of substrate 110 underneath pits 610 which electrochemical etching is initiated at the bottom of pits 610. And, in some embodiments, cavities 124 (FIG. 7) may have a width-to-depth ratio of at least 1:2 or greater. In other words, the vertical dimension, that is, the height or depth dimension, of cavities 124 is at least about two times (2×) greater than the horizontal dimension, that is, the width or diameter dimension, of cavities 124. Further, in some embodiments, the width-to-depth ratio of cavities 124 is at least 1:4, that is, the depth of cavities 124 is at least about four times (4×) greater than the width of cavities 124. For example, in one embodiment, the width of cavities 124 is about one micron or less and the depth of cavity 124 is about four microns or greater. Increasing the depth of cavity 124 with respect to the width of cavity 124 may result in a relatively lower dielectric constant for dielectric platform 104 since more empty space may be formed in dielectric platform 104. In addition, in some embodiments, the depth of cavities 124 is at least about ten times (10×) greater than the width of cavities 124 and this may be achieved through electrochemical etching of substrate 110 underneath pits 610.

The surface morphology of the etched surfaces, etch rate and cavity profile are dependent on the specific concentration of the etchant, the substrate conductivity type, substrate resistivity, electrochemical etch current, illumination intensity and wavelength and the etchant temperature. Referring again to FIG. 7, cavities 124 may have sidewalls 790 and 795 perpendicular to, or substantially perpendicular to surface 105 of substrate 110. Sidewalls 790 are on the edge of dielectric platform 104 and are referred to here as external sidewalls. Sidewalls 795 comprise the sidewalls of cavities 124 that are interior to dielectric platform 104, referred to here as internal sidewalls. While the sidewalls 790 and 795 in FIG. 7 are perpendicular to, or substantially perpendicular to surface 105 of substrate 110, other sidewall profiles may also be utilized and the specific sidewall profile is not a limitation of the present invention. Furthermore, while FIG. 1 shows the tops of silicon structures 136 as coplanar, or substantially coplanar with surface 105 of substrate 110, the tops of silicon structures 136 may be coplanar, or above or below surface 105 of substrate 110. The relative height of silicon structures 136 with respect to surface 105 of substrate 110 is not a limitation of the present invention.

Turning again to FIG. 7, in some embodiments exterior sidewalls 790 of dielectric platform 104 (FIG. 1 or FIG. 2) may serve as termination for equipotential lines during depletion of active devices formed in active regions 106 and/or 107. Thus, as is discussed further below, equipotential lines impinge on exterior sidewalls 790. In other words, a termination structure comprising exterior sidewalls 790 provides termination for equipotential lines from an electric field in an active area formed adjacent to the termination structure. It may be desirable for exterior sidewalls 790 to be straight and smooth and perpendicular to surface 105 of substrate 110 so that the electric field lines are substantially perpendicular to exterior sidewalls 790 so that a condition that is referred to as planar breakdown is achieved where equipotential lines terminate at a perpendicular angle, or a substantially perpendicular angle, to the exterior sidewalls 790. Equipotential lines that impinge on exterior sidewalls 790 at an angle that is not perpendicular to exterior sidewalls 790 may decrease the breakdown voltage of active devices formed in active region 106, active region 107, or both. In such an embodiment, it is preferable to form exterior sidewalls 790 using a high quality dielectric material 134, as discussed below.

Figure 9:
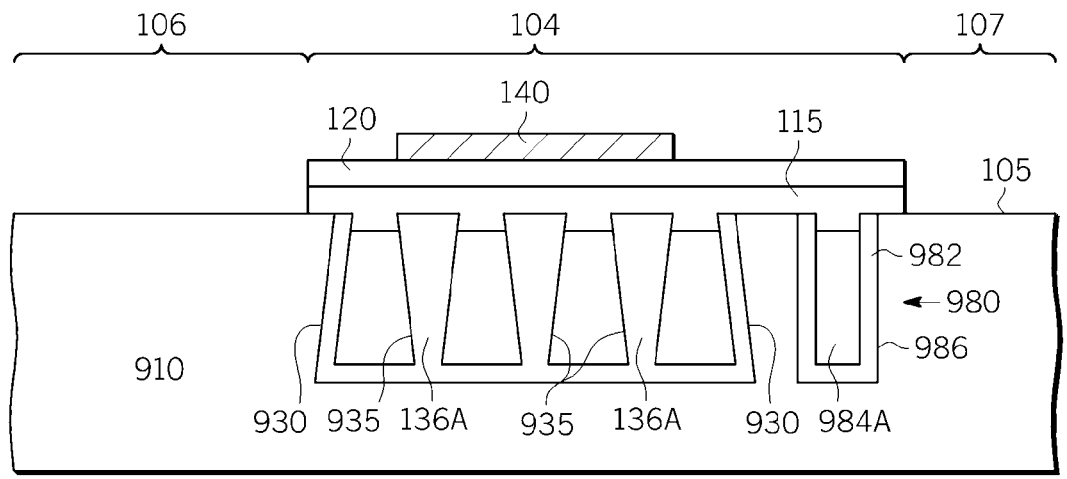
FIG. 9 is a cross-sectional view of another semiconductor structure in accordance with an embodiment of the present invention.

In embodiments where it is desirable for equipotential lines of a depletion layer to terminate on a surface that is perpendicular, or substantially perpendicular to surface 105 of substrate 110, but exterior sidewalls 790 are not perpendicular, or substantially perpendicular to surface 105 of substrate 110, an optional dielectric termination structure 980 (FIG. 9) may be formed. FIG. 9 shows semiconductor structure 900 comprising a sealed cavity 984A and a dielectric layer 982 which may be formed in substrate 910. In some embodiments dielectric layer 982 may comprise silicon dioxide. Optional dielectric termination structure 980 may be part of dielectric platform 104 or may be laterally spaced apart from dielectric platform 104. In other embodiments, sealed cavity 984A may be partially filled, substantially filled or completely filled with one or more dielectric materials (not shown) such as, for example, an oxide, a nitride, or undoped polysilicon.

Optional termination structure 980 has exterior dielectric sidewall 986 that is perpendicular, or substantially perpendicular, to the upper surface 105 of substrate 910. Termination structure 980 serves as termination for equipotential lines during depletion of active devices formed in active region 107. Thus, as is discussed above, equipotential lines impinge on dielectric sidewalls 986. In other words, termination structure 980 may provide termination for equipotential lines from an electric field in an active area formed adjacent to termination structure 980. It may be desirable for sidewalls 986 to be straight and smooth so that the equipotential lines are substantially perpendicular to sidewalls 986 so that a condition that is referred to as planar breakdown is achieved where equipotential lines terminate at a perpendicular angle, or a substantially perpendicular angle, to the dielectric sidewalls 986. Equipotential lines that impinge on sidewalls 986 at an angle that is not perpendicular to sidewalls 986 may decrease the breakdown voltage of active devices formed in active region 107.

It should be noted that including dielectric termination structure 980 is optional. Termination structure 980 may be desirable in applications where high voltage and/or high power is desired and where the lateral boundaries of dielectric platform 104 do not include a sidewall that is perpendicular, or substantially perpendicular to upper surface 105 of substrate 910. For example, referring to FIG. 9, sidewalls 930 and 935 are angled, and not perpendicular, to surface 105 of substrate 910. Accordingly, termination structure 980 may be included to provide a dielectric sidewall 986 that is perpendicular to, or substantially perpendicular to, surface 105 of substrate 910.

While the optional termination structure 980 shown in FIG. 9 is between dielectric platform 104 and active area 107, this is not a limitation of the present invention. Optional termination structures may be adjacent to a portion of one or more dielectric platforms, or may completely surround one or more dielectric platforms.

Referring back to FIG. 7 dielectric material 134 is formed on the exposed surfaces of cavities 124. In one example, the dielectric material 134 is silicon dioxide and is formed by thermal oxidation. In this example thermal oxidation is performed to convert a portion of, all of, or substantially all of, the silicon of structures 136, a portion of silicon substrate 110 adjacent to exterior walls 790 and a portion of the silicon substrate 110 under cavities 124 to silicon dioxide to form silicon dioxide layers 134. FIG. 7 shows an example where a portion of the silicon in vertical structure 136 has been converted to silicon dioxide. FIG. 2 shows an example where all or, or substantially all of the silicon in vertical structure 136 has been converted to silicon dioxide. In FIG. 2 vertical structure 136 is referenced as 136A and is comprised of silicon dioxide.

As discussed above, the width of silicon structure 136 is typically about 3.0 microns or less in some embodiments. It should be noted that the thicker the width of silicon structure 136, the longer it will take to fully oxidize silicon structure 136. The embodiment shown in FIG. 1 shows partially oxidized silicon structures 136. In an alternate embodiment, silicon structures 136 may be completely oxidized and converted to silicon dioxide, as referenced by 136A in FIG. 2. In addition, as shown in FIGS. 1 and 2, during the thermal oxidation process, the bottom of sealed cavities 124, as well as portions of substrate 110 adjacent to exterior walls 790, are also converted to silicon dioxide. Since the dielectric constant of silicon is greater than the dielectric constant of silicon dioxide, reducing the amount of silicon remaining in silicon structure 136 (FIG. 1) will reduce the effective dielectric constant of dielectric platform 104, but it may also increase the stress in the structure because of the 2.2× volume expansion that occurs upon oxidation of silicon.

The width of cavities 124 may be dependent on the method of capping, as discussed below. In the embodiment shown in FIG. 1, a non-conformal cap structure is used. In this case, the width of cavities 124 is small enough to permit sealing of cavities 124, thus forming sealed voids 124A (FIG. 1), without completely filling cavities 124. Accordingly, the cavity width is selected so that after the thermal oxidation, oxide layers 134 do not touch inside sealed cavities 124A (FIG. 1). In some embodiments, the width ranges from about 0.1 microns to about 3 microns. The width of cavities 124 is not a limitation of the present invention and may be adjusted to best match the method used for capping.

After formation of dielectric layer 134, dielectric layers 510 and 512 may be optionally removed. Referring to the example shown in FIG. 1, dielectric layers 510 and 512 have been removed. After optional removal of dielectric layers 510 and 512, capping structure 116 is formed over cavities 124 (FIG. 7), dielectric material 134 and structures 136. Capping structure 116 may comprise one or more layers. In the embodiment shown in FIG. 1 capping structure is comprised of dielectric layers 115 and 120.

In some embodiments, dielectric layer 115 may comprise silicon dioxide and may be formed by low temperature chemical vapor deposition (CVD). Other suitable materials for dielectric layer 115 include silicon nitride, phosphosilicate glass (PSG), borosilicate glass (BSG), or borophosphosilicate glass (BPSG), an oxide formed using tetraethylorthosilicate (TEOS), or the like. Dielectric layer 115 may have a thickness ranging from about 1000 Angstroms to about 4 microns. During formation of dielectric layer 115 the material of the capping structure may enter a portion of cavities 124 (FIG. 7), but not fill cavities 124 (FIG. 7) due in part to the relatively small width of the cavities 124 (FIG. 7), thereby forming a capped or sealed cavity 124A (FIG. 1). Dielectric layer 115 may be optionally planarized using, for example, a Chemical Mechanical Planarization ("CMP") technique. In an alternate embodiment, the material of dielectric layer 115 may substantially or completely fill cavity 124 (FIG. 7).

Referring again to FIG. 1, an optional sealing layer 120 such as, for example, silicon nitride ($Si_3N_4$), may be formed over silicon dioxide layer 115 to hermetically seal cavity 124 (FIG. 7). In other words, in embodiments where dielectric layer 115 is a silicon dioxide layer, the optional conformal silicon nitride layer 120 may prevent diffusion through and/or fill in any openings or cracks in the silicon dioxide dielectric layer 115, and in general prevent the propagation of gases or moisture into sealed cavities 124A through dielectric layer 115. Silicon nitride layer 120 may be formed using a low pressure chemical vapor deposition (LPCVD) and may have a thickness of ranging from about 100 Angstroms to about 5000 Angstroms. In one embodiment, the thickness of silicon nitride layer 120 is about 500 Angstroms. A partial vacuum may be formed in sealed cavities 124A as part of the LPCVD process. If optional sealing layer 120 is used, the CMP may be performed prior to the formation of optional sealing layer 120 to prevent removal of sealing layer 120 during the CMP process.

Accordingly, the capping or sealing of cavities 124 may be accomplished by forming a non-conformal material followed by a conformal material. In this example, the non-conformal layer such as, for example, layer 115, may enter into a portion of cavity 124, but not fill cavity 124, due in part to the relatively small size of the width of cavities 124 and since layer 115 is a non-conformal layer. Then a conformal material such as, for example, layer 120, may be formed on layer 115.

In some embodiments, sealed cavity 124A is evacuated to a pressure less than atmospheric pressure. In other words, the pressure in sealed cavity 124A is below atmospheric pressure. As an example, the pressure in sealed cavity 124A may range from approximately 0.1 Torr to approximately 10 Torr. The type of substance or material within sealed cavity 124A is not a limitation of the present invention. For example, cavity 124A may contain a gas, a fluid, or a solid matter.

Referring back to FIG. 1, the portions of capping structure 116, dielectric layer 512 and dielectric layer 510 (if not removed previously) in active regions 106 and 107 are removed after the formation of capping layer structure 116. Active and passive semiconductor devices may be formed in or from the portions of substrate 110 adjacent DP 104. In addition, active or passive circuit elements, or portions thereof, may be formed on DP 104. Referring again to FIG. 1, a passive circuit element 140 is formed on DP 104.

The structure shown in FIG. 1 and in plan view in FIG. 4 will result in the formation of a plurality of sealed voids 124A that are separated from each other, that is the interior of each sealed void 124A is not in contact with the interior of any other sealed void 124A. Accordingly, if there is any rupture or fracture in dielectric platform 104, the extent of the rupture or fracture is limited and may only affect a portion of the dielectric platform. In other embodiments, some or all of sealed voids 124A may be fabricated so that they are much larger than those in FIG. 1, or such that a one or more voids are inter-connected. In this example, a rupture or fracture in dielectric platform 104 may affect a portion, or substantial portion or all of dielectric platform 104.

Referring back to FIG. 7, in this embodiment of the present invention the sidewalls 790 and 795 (FIG. 7) are perpendicular, or substantially perpendicular to surface 105 of substrate 110.

Figure 10:
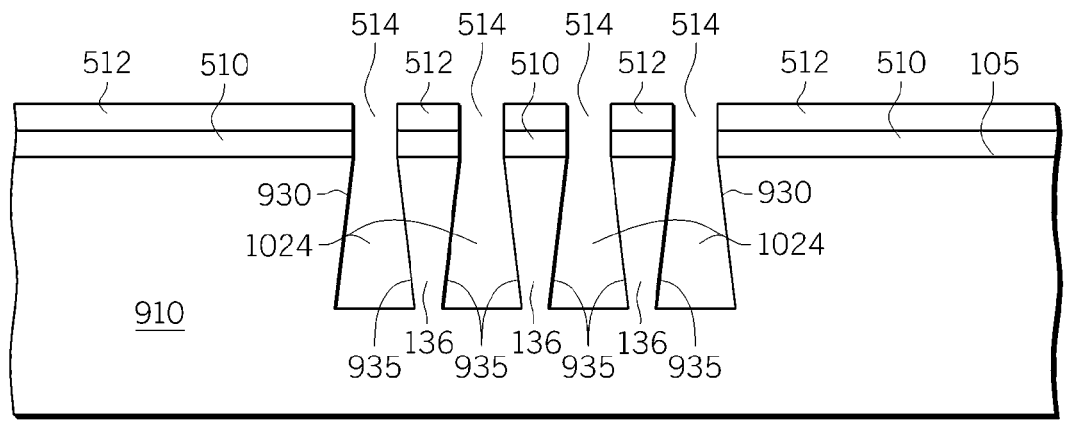
FIG. 10 is a cross-sectional view of the semiconductor structure of FIG. 9 at an early stage of fabrication.

In another embodiment, shown in FIG. 9, sidewalls 930 and 935 are not perpendicular to surface 105 of substrate 910. FIG. 10 shows semiconductor structure 900 of FIG. 9 at an early stage of manufacturer. After openings 514 have been formed in dielectric layer 512 and dielectric layer 510, electrochemical etching is performed to form cavities 1024 with sidewalls 930 and 935 that are not perpendicular to surface 105 of substrate 910. The angle of sidewalls 930 and 935 may be controlled by varying process parameters, for example the etch current, as a function of time during the electrochemical etch step. In another embodiment, the resistivity of the substrate 910 may be varied in the direction perpendicular to surface 105. Because the cavity size is dependent on process and substrate parameters, for example electrochemical etch current and substrate resistivity, the width of cavities 1024 will vary as a function of depth into substrate 910. The electrochemical etch current may be varied manually or be controlled by a computer or other similar control mechanism. The resistivity of substrate 910 may be varied by doping, for example using ion implantation or diffusion, or by the growth of one or more epitaxial layers with varying doping levels or by bonding two or more semiconductor layers, each with different doping levels, together. In another example, the optional front and/or back illumination may be varied during the electrochemical etch step.

In the example shown in FIG. 10, cavities 1024 have a width that is relatively narrower at the top, near surface 105, of cavities 1024 than at the bottom of cavities 1024. However, this is not a limitation of the present invention. The width of cavities 1024 may also be relatively wider at the top, near surface 105, of cavities 1024 than at the bottom of cavities 1024. Furthermore, in the example shown in FIG. 10, the width of cavities 1024 monotonically changes as a function of depth, from surface 105 into substrate 910. However, this is not a limitation of the present invention and the width of cavities 1024 may vary in any fashion as a function of depth, from surface 105 into substrate 910.

Figure 11:
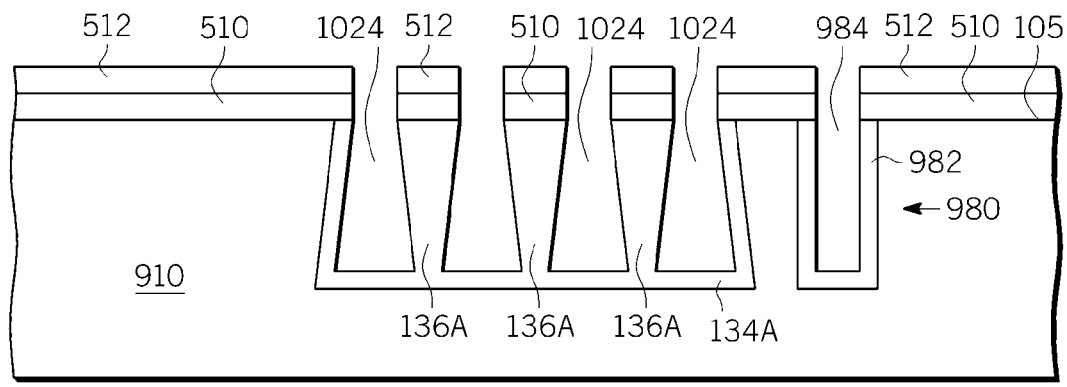
FIG. 11 is a cross-sectional view of the semiconductor structure of FIG. 10 at a later stage of fabrication.

After formation of cavities 1024, dielectric material 134A (FIG. 11) may be formed on the exposed surfaces of cavities 1024. In one example, the dielectric material is silicon dioxide and is formed by thermal oxidation. Thermal oxidation may be performed to convert a portion of, all of, or substantially all of, the silicon of structures 136 (FIG. 10), a portion of silicon substrate 910 adjacent to exterior walls 930 and a portion of the silicon substrate 910 under cavities 1024 to silicon dioxide to form silicon dioxide layers 134A. FIG. 11 shows an example where all or, or substantially all of the silicon in vertical structure 136 (FIG. 10) has been converted to silicon dioxide. In FIG. 11 vertical structure 136 is referenced as 136A and is comprised of silicon dioxide. In another example (not shown) only a portion of silicon in vertical structure 136 (FIG. 10) may be converted to silicon dioxide.

Referring now to FIG. 11 which shows semiconductor structure 900 of FIG. 10 at a later stage of fabrication, after formation of a dielectric layer on the interior surfaces of cavities 1024, here referenced as dielectric structures 136A and dielectric layer 134A, if an optional termination structure 980 is desired, dielectric layers 510 and 512, and semiconductor material 910 may be patterned and then portions of layer 512, layer 510, and substrate 910 etched using an etch process such as, for example, a reactive ion etch (RIE), to form a cavity 984 that surrounds or partially surrounds dielectric platform 104. Cavity 984 may also be referred to as an opening, a trench, a void, a gap, an empty region, an empty space, or the like. After cavity 984 is formed, a dielectric layer 982 is formed along the exposed interior surfaces of cavity 984. Dielectric layer 982 and cavity 984 form a dielectric termination structure 980 as is discussed above. In some embodiments, dielectric layer 982 is an oxide layer such as silicon dioxide having a thickness ranging from about 50 Angstroms to about 5000 Angstroms. Oxide layer 982 may be formed using deposition techniques or thermal growth techniques such as, for example, thermal oxidation of silicon. If a thermal oxidation process is used to form oxide layer 982 of optional termination structure 980, then other portions of structure 900 may also be affected by the oxidation. For example, the amount of silicon dioxide in layer 134A may be increased as part of this thermal oxidation. Further, in alternate embodiments, silicon structures 136A may be partially oxidized during the initial thermal oxidation described above, so that structures 136 (FIG. 10) comprise silicon and silicon dioxide and then part of, or all of, the remaining silicon in silicon structures 136 (FIG. 10) may be further converted to silicon dioxide using the subsequent thermal oxidation process that is used to form oxide layer 982. Accordingly, the thickness of oxide layer 982 and the amount of silicon dioxide on the interior surfaces of cavity 1024, and in silicon structures 136 (FIG. 10) may be controlled by varying the timing of the two thermal oxidation processes used to form oxide layer 134A and oxide layer 982.

In this embodiment, optional termination structure 980 has been formed after formation and oxidation of cavities 1024, however this is not a limitation of the present invention. In other embodiments, optional termination structure 980 may be formed prior to or simultaneously with formation of cavities 1024.

Referring to FIG. 9, in some embodiments which include optional termination structure 980, sealed cavity 984A is evacuated to a pressure less than atmospheric pressure. In other words, the pressure in sealed cavity 984A is below atmospheric pressure. As an example, the pressure in sealed cavity 984A may range from approximately 0.1 Torr to approximately 10 Torr. The type of substance or material within sealed cavity 984A is not a limitation of the present invention. For example, cavity 984A may contain a gas, a fluid, or a solid matter.

In all of the examples described above, the shape, size and spacing of the formed cavities is initially determined by a lithography step. In other words, the shape, size and spacing of the cavities is determined by the design of the photomask used in the lithography step, and thus ultimately by the designer of the dielectric platform. In another embodiment, cavities may be formed without the use of a photomask and lithography step. In this embodiment, electrochemical etching of the silicon forms a relatively random, or substantially random network of cavities. To some extent the shape, size and position of the cavities in this embodiment are determined by the specific concentration of the etchant, substrate conductivity type, substrate resistivity, electrochemical etch current, illumination intensity and wavelength and the etchant temperature. However, unlike the previous examples, where multiple dielectric platforms made with the same mask set would have the same, or substantially the same number of cavities, with the same, or substantially the same shape, size and position, in this embodiment, multiple dielectric platforms would have a similar aggregate volume ratio of semiconductor material to void space and/or dielectric material, but would not have the same, or substantially the same number of cavities, with the same, or substantially the same shape, size and position.

In this embodiment where the cavities are etched without the use of a mask, the cavities may be relatively smaller in later extent than those formed with the use of a mask. The smaller lateral extent of the cavities at the surface makes it easier to cap the cavities during the formation of the dielectric platform.

Figure 12:
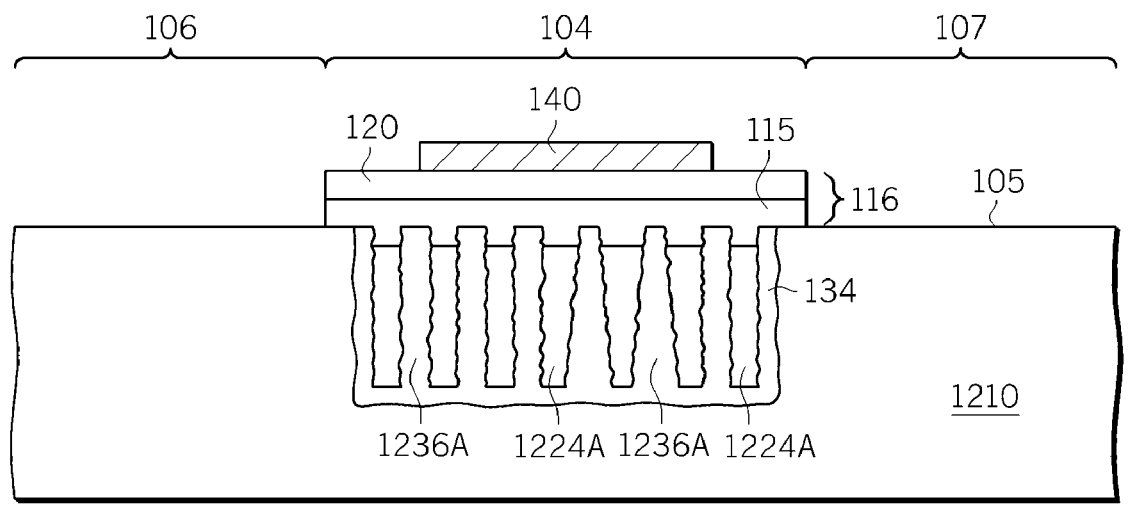
FIG. 12 is a cross-sectional view of another semiconductor structure in accordance with an embodiment of the present invention.

Referring now to FIG. 12, FIG. 12 shows a cross-sectional view of semiconductor structure 1200 that illustrates a dielectric platform 104, active regions 106 and 107, and an electrically conductive material 140. Dielectric platform 104 of semiconductor structure 1200 comprises vertical structures 1236A, sealed voids 1224A, dielectric materials 134, and dielectric structure 116 over vertical structures 1236A, sealed voids 1224A and dielectric materials 134. At least a portion of dielectric platform 104 may be between electrically conductive material 140 and substrate 1210 to reduce parasitic capacitance between electrically conductive material 140 and substrate 1210. In other embodiments of the present invention, at least a portion of dielectric platform 104 is between at least a portion of electrically conductive material 140 and at least a portion of substrate 1210 to reduce capacitance between electrically conductive material 140 and substrate 1210.

Active regions 106 and 107 are comprised of a portion of substrate 1210. In some embodiments of the present invention, substrate 1210 may be referred to as a device layer or an active layer. Further, in some embodiments, substrate 1210 may include one or more epitaxial layers or bonded layers. Substrate 1210 may be used as an active area where active devices, such as, for example, transistors or diodes, or portions of active devices, may be subsequently formed. Active devices may be formed in active regions 106 and 107 using conventional MOS (metal oxide semiconductor), complementary metal oxide semiconductor (CMOS), bipolar, or bipolar-CMOS (BiCMOS) processes.

Substrate 1210 may comprise a semiconductor material such as, for example, silicon, and may be doped or undoped depending on the application.

Because sealed voids 1224A may have relatively smaller lateral extant than the sealed voids 124A of FIG. 1, sealed voids 1224A may also be referred to as sealed pores. In some embodiments, the width of sealed pores 1224A ranges from about 10 nanometers (nm) to about 2.0 μm. In some embodiments, sealed pores 1224A are hermetically sealed to prevent any contamination from undesirable gasses or moisture that may propagate into sealed voids 1224A. Sealed voids 1224A may be evacuated to a pressure less than atmospheric pressure. In other words, the pressure in sealed voids 1224A is below atmospheric pressure. As an example, the pressure in sealed voids 1224A may range from approximately 0.1 Torr to approximately 10 Torr. The type of substance or material within sealed voids 1224A is not a limitation of the present invention. For example, sealed voids 1224A may contain a gas, a fluid, or a solid matter.

Figure 13:
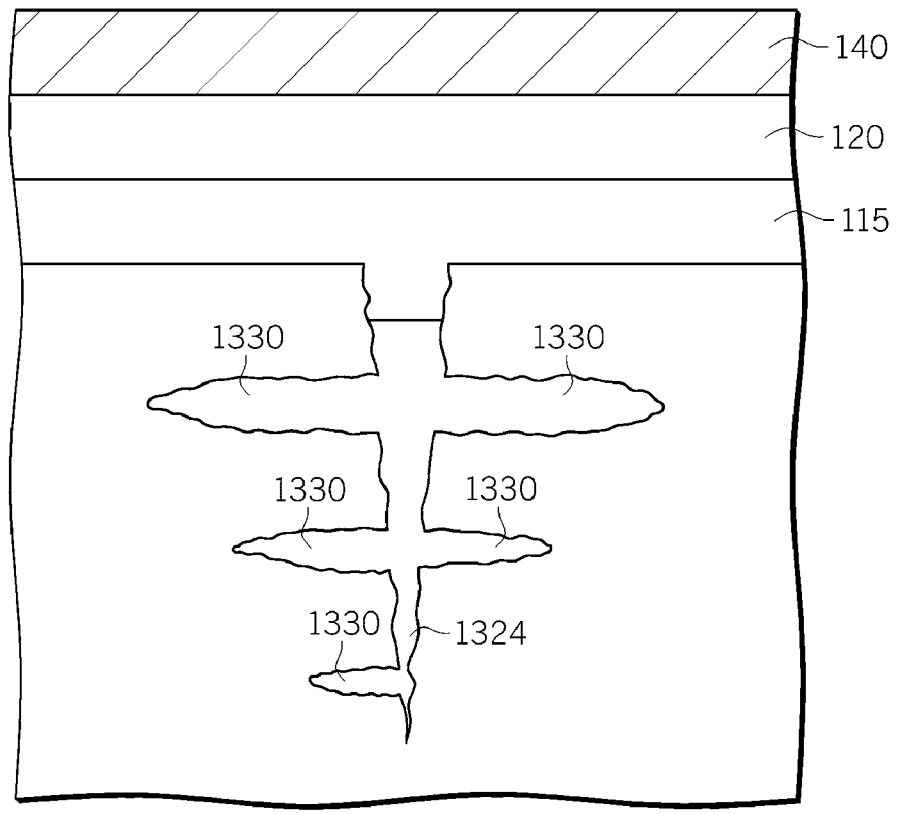
FIG. 13 is a cross-sectional view of the another semiconductor structure in accordance with an embodiment of the present invention.

Vertical structure 1236 may be, for example, a pillar or a wall segment or a wall, and may comprise a portion of substrate 1210 and portions of dielectric material 134 between sealed voids 1224A. In some embodiments, sealed pores 1224A may have a circular, or substantially circular cross-section and vertical structures 1236 surround the circular, or substantially circular sealed voids 1224A. In other embodiments sealed pores 1224A may have a dendritic shape. Referring to FIG. 13, FIG. 13 shows semiconductor structure 1300 which is a portion of a dielectric platform, with a sealed pore 1324A with a dendritic shape that is comprised of sub-pores 1330 branching off of the main sealed pore 1324A. Note that FIG. 13 shows only a portion of a dielectric platform, and the complete dielectric platform may comprise a plurality of sealed pores. In another embodiment (not shown), sealed pores 1224A may have a morphology consisting of interconnected voids, resembling that of a sponge. The shape of sealed pores 1224A (FIG. 12) is not a limitation of the present invention. Sealed pores 1224A (FIG. 12) may have any arbitrary shape.

In some embodiments, vertical structures 1236A may comprise only dielectric material, as shown in FIG. 13. In other embodiments (not shown), vertical structures 1236A may comprise a portion of substrate 1210 and a part of dielectric material 134. For example, as is discussed below, in some embodiments, a thermal oxidation may be performed to convert a portion of, or substantially all of substrate 1210 adjacent to pores 1224 (FIG. 14) to silicon dioxide, thereby forming silicon dioxide layer or region 134 which includes structures 1236 (FIG. 14).

Figure 14:
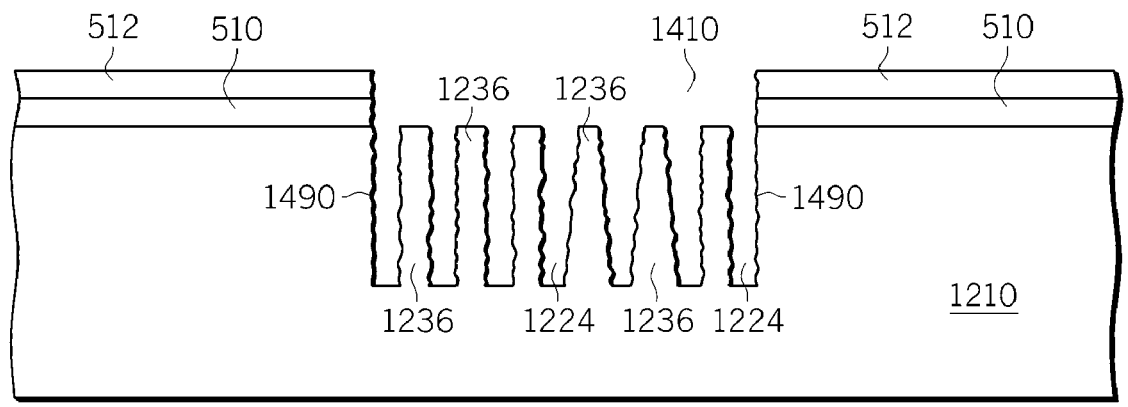
FIG. 14 is a cross-sectional view of the semiconductor structure of FIG. 12 at an early stage of fabrication.

Referring now to FIG. 14, FIG. 14 shows semiconductor structure 1200 of FIG. 12 at an early stage of manufacturer. At the stage illustrated in FIG. 14, dielectric layer 510 is formed over substrate 1210 and dielectric layer 512 is formed over dielectric layer 510. In one example dielectric layer 510 may be silicon dioxide and dielectric layer 512 may be silicon nitride. Dielectric layer 510 may comprise, for example, silicon dioxide and have a thickness ranging from about 50 Angstroms (Å) to about 5,000 Angstroms. Dielectric layer 510 may be formed using deposition techniques or thermal growth techniques such as, for example, thermal oxidation of silicon. Dielectric layer 512 may comprise, for example, silicon nitride ($Si_3N_4$) and have a thickness ranging from about 100 Angstroms (Å) to about 15,000 Angstroms. Dielectric layer 512 may be formed using deposition techniques, for example, low pressure chemical vapor deposition (LPVCD) of silicon nitride.

In an alternate embodiment, only dielectric material 510 may be formed (not shown). Dielectric layer 510 may comprise, for example, silicon dioxide and have a thickness ranging from about 1000 Angstroms (Å) to about 20,000 Angstroms.

After dielectric layer 512 is formed, dielectric layer 512 and dielectric layer 510 may be patterned using photolithography and etching processes to form an opening 1410. Opening 1410 may be formed using at least one etching operation. In some embodiments, two etching operations may be used to form opening 1410. In some embodiments, silicon nitride layer 512 may be etched using a wet chemical etch or a dry etch process such as, for example, a reactive ion etch (RIE). Silicon dioxide layer 510 may be etched using a wet chemical etch or a dry etch process such as, for example, a reactive ion etch (RIE).

Opening 1410 is the shape and size of the desired dielectric platform. In some embodiments, the width of dielectric platform 104 may be at least about three microns or greater. While FIG. 14 shows one opening 1410, this is not a limitation of the present invention. Semiconductor structure 1200 may comprise one or more openings 1410, each of which may have any shape or size and the various openings may be formed in a periodic or non-periodic arrangement.

Figure 15:
FIG. 15 is a cross-sectional view of the semiconductor structure of FIG. 14 at a later stage of fabrication.

After formation of one or more openings 1410, electrochemical etching is performed to form pores 1224. This may be performed using an apparatus similar to that shown in FIG. 8. Electrochemical etching forms a network of pores 1224 in substrate 1210, as shown in FIG. 14. Accordingly, structure 1200, illustrated with reference to FIGS. 12, 14, and 15, is an example of a dielectric platform 104 that has cavities 1224 that are formed without the use of a photomask and lithography process. Instead, as is described above, electrochemical etching of a silicon substrate forms a relatively random, or substantially random network of cavities 1224.

As is discussed below with reference to FIG. 15 dielectric material 134 is formed on the exposed surfaces of cavities 1224. In one example, dielectric material 134 is silicon dioxide and is formed by thermal oxidation. In this example thermal oxidation is performed to convert a portion of, all of, or substantially all of, the silicon of structures 1236 (FIG. 14), a portion of silicon substrate 1210 adjacent to exterior walls 1490 (FIG. 14) and a portion of the silicon substrate 1210 under pores 1224 (FIG. 14) to silicon dioxide to form silicon dioxide layers 134. FIG. 15 shows an example in which all of the silicon in vertical structure 1236 (FIG. 14) has been converted to silicon dioxide. In FIG. 15 vertical structure 1236 is referenced as 1236A and is comprised of silicon dioxide. In another embodiment (not shown) vertical structures 1236 (FIG. 14) may be only partially oxidized and may comprise a portion of dielectric material 134 and a portion of substrate 1210.

After formation of dielectric layer 134, dielectric layers 510 and 512 may be optionally removed. Referring to the example shown in FIG. 12, dielectric layers 510 and 512 have been removed. After optional removal of dielectric layers 510 and 512, capping structure 116 is formed over pores 1224 (FIG. 15), dielectric material 134 and structures 1236A. Capping structure 116 may comprise one or more layers. In the embodiment shown in FIG. 12 capping structure 116 is comprised of dielectric layers 115 and 120. This process proceeds in a similar fashion to that described for semiconductor structure 100 shown in FIG. 1.

As is described for semiconductor structure 900 (FIG. 9), an optional termination structure (not shown) may be formed either before or after the formation of pores 1224 (FIG. 15).

In all of the examples described above although the dielectric platform is described as having one or more sealed cavities, the methods and apparatuses described herein are not limited in this regard. For example, referring back to FIG. 1, dielectric platform 104 is described as having one or more sealed cavities 124A. In alternate embodiments, sealed cavities 124A could be partially, or substantially filled, or completely filled with a material, such as, for example, a material comprising an oxide, nitride, or silicon if so desired, to form a solid or filled dielectric platform (not shown) that is devoid of any cavities. Such a solid or filled dielectric platform would have a relatively higher dielectric constant compared to an air-gap dielectric platform such as dielectric platform 104 since the material used to fill sealed cavities 124A would have a higher dielectric constant compared to an opening or void. Examples of materials that may be used to fill, or backfill, sealed cavities 124A may include silicon nitride, polycrystalline silicon, or an oxide material formed using, for example, a hot wall TEOS process.

A portion of a dielectric material 115, a portion of a dielectric material 120, a portion of a dielectric materials 134, and vertical structures 136 in combination with sealed cavities 124A cooperate to form dielectric platform 104 shown in FIG. 1. Active and passive semiconductor devices may be formed in or from the portions of substrate 110 adjacent dielectric platform 104. In addition, active or passive circuit elements may be formed on dielectric platform 104. As an example, the passive component may comprise electrically conductive material 140, wherein electrically conductive material 140 may comprise, for example, aluminum, copper, or doped polycrystalline silicon. In various examples, the passive component may be an inductor, a capacitor, a resistor, or an electrical interconnect.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or breakdown voltages of any devices formed using, or in conjunction with, a structure that includes the disclosed dielectric platform. In addition, the disclosed dielectric platform and the methods for making the dielectric platform may reduce stress that may be imparted to regions adjacent to the dielectric platform compared to other techniques and structures.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method to manufacture a semiconductor structure, comprising:
   removing a portion of a semiconductor material using an electrochemical etch to form a first cavity that extends at least about one micron or greater below the surface of the semiconductor material, a second cavity that extends at least about one micron or greater below the surface of the semiconductor material, wherein the first cavity is isolated from the second cavity, a first protrusion is between the first cavity and the second cavity, and the semiconductor material comprises silicon;
   performing a thermal oxidation to convert a portion of the silicon of the semiconductor material to silicon dioxide; and
   forming a first dielectric material over the first cavity, over the second cavity, over at least a portion of the semiconductor material, and over at least a portion of the first protrusion;
   wherein the electrochemical etch is preceded by an etch to form a cavity wherein a width of a lower portion of the cavity is substantially less than a width of an upper portion of the cavity.

2. The method of claim 1, wherein the first dielectric material is rigid or substantially rigid.

3. The method of claim 1, wherein the first dielectric material caps the first cavity and second cavity and wherein the first protrusion comprises the semiconductor material.

4. The method of claim 1, wherein the first protrusion comprises silicon dioxide.

5. The method of claim 1, further comprising forming at least a portion of an electrically conductive material over at least a portion of the first dielectric material.

6. The method of claim 1, wherein a pressure in the first cavity is below atmospheric pressure.

7. The method of claim 1, further comprising forming at least a portion of an active device in the semiconductor material.

8. The method of claim 1, wherein a sidewall of the first cavity is perpendicular to, or substantially perpendicular to, the surface of the semiconductor material.

9. The method of claim 1, wherein a sidewall of the first cavity is non-perpendicular to the surface of the semiconductor material.

10. The method of claim 1, wherein the etch preceding the electrochemical etch is an orientation-dependent etch.

11. The method of claim 10, wherein the orientation dependent etch is a potassium hydroxide-based (KOH) etch, an ethylene diamine pyrocatechol-based (EDP) etch, a tetramethylammonium hydroxide-based (TMAH) etch, or a hydrazine-based etch.

12. The method of claim 1, further comprising:
   forming a second dielectric material over the first dielectric material; and
   forming at least a portion of an electrically conductive material over at least a portion of the second dielectric material, wherein the semiconductor material comprises silicon, the semiconductor material comprises one or more epitaxial layers, the first protrusion comprises silicon dioxide, the first dielectric material comprises silicon dioxide, the second dielectric material comprises silicon nitride ($Si_3N_4$), and the electrically conductive material comprises aluminum, copper, or doped polycrystalline silicon.

13. The method of claim 1, further comprising planarizing the first dielectric material using a Chemical Mechanical Planarization ("CMP") process.

14. A method to manufacture a semiconductor structure, comprising:
   removing a portion of a semiconductor material using an electrochemical etch to form a first cavity that extends at least about one micron or greater below the surface of the semiconductor material, wherein the semiconductor material comprises silicon;
   performing a thermal oxidation to convert a portion of the silicon of the semiconductor material to silicon dioxide; and
   forming a first dielectric material over the first cavity and over at least a portion of the semiconductor material, wherein the first dielectric material is rigid or substantially rigid;
   wherein the electrochemical etch is preceded by an etch to form a cavity wherein a width of a lower portion of the cavity is substantially less than a width of an upper portion of the cavity.

15. The method of claim 14, wherein the etch preceding the electrochemical etch is an orientation-dependent etch.

16. The method of claim 15, wherein the orientation dependent etch is a potassium hydroxide-based (KOH) etch, an ethylene diamine pyrocatechol-based (EDP) etch, a tetramethylammonium hydroxide-based (TMAH) etch, or a hydrazine-based etch.

17. A method to manufacture a semiconductor structure, comprising:

removing a portion of a semiconductor material using an electrochemical etch to form a plurality of cavities without the use of a mask to define each cavity of the plurality of cavities, wherein the removing forms a first protrusion between at least two cavities of the plurality of cavities and wherein a depth of a first cavity of the plurality of cavities is at least about two times (2×) greater than a width of the first cavity;

forming a first dielectric material over at least one cavity of the plurality of cavities to seal the at least one cavity;

forming at least a portion of an active device in the semiconductor material; and forming at least a portion of an electrically conductive material over at least a portion of the first dielectric material, wherein the electrically conductive material is coupled to the active device.

18. The method of claim 17, wherein one or more cavities of the plurality of cavities extends at least about one micron or greater below the surface of the semiconductor material.

19. The method of claim 17, further comprising performing a thermal oxidation to convert at least a portion of the semiconductor material to a dielectric material.

20. The method of claim 17, wherein a width of the first cavity is about one micron or less and the depth of the first cavity is about four microns or greater.

21. The method of claim 17, wherein the depth of the first cavity is at least about ten times (10×) greater than the width of the first cavity.

* * * * *